United States Patent [19]

Shinozaki

[11] Patent Number: 4,507,849

[45] Date of Patent: Apr. 2, 1985

[54] METHOD OF MAKING ISOLATION GROOVES BY OVER-FILLING WITH POLYCRYSTALLINE SILICON HAVING A DIFFERENCE IN IMPURITY CONCENTRATION INSIDE THE GROOVES FOLLOWED BY ETCHING OFF THE OVERFILL BASED UPON THIS DIFFERENCE

[75] Inventor: Satoshi Shinozaki, Yokohama, Japan

[73] Assignee: Tokyo Shibaura Denki Kabushiki Kaisha, Japan

[21] Appl. No.: 507,557

[22] Filed: Jun. 24, 1983

Related U.S. Application Data

[63] Continuation of Ser. No. 285,507, Jul. 21, 1981, abandoned.

[30] Foreign Application Priority Data

Jul. 28, 1980 [JP] Japan .................................. 55-103341
Dec. 12, 1980 [JP] Japan .................................. 55-175292
Dec. 12, 1980 [JP] Japan .................................. 55-175293
Mar. 5, 1981 [JP] Japan .................................. 56-31602

[51] Int. Cl.³ ..................... H01L 21/20; H01L 21/306
[52] U.S. Cl. ........................ 29/576 W; 29/571; 29/576 B; 29/578; 29/590; 148/1.5; 148/187; 148/175; 156/657; 357/51
[58] Field of Search ................ 148/1.5, 187, 175; 29/576 W, 576 B, 578, 590, 571; 156/657; 357/51

[56] References Cited

U.S. PATENT DOCUMENTS

| | | | |
|---|---|---|---|
| 3,892,608 | 3/1975 | Kuhn | 148/188 |
| 3,979,237 | 9/1976 | Morcom et al. | 148/187 |
| 4,026,736 | 5/1977 | Lesk | 148/187 |
| 4,233,091 | 11/1980 | Kawabe | 148/175 |
| 4,255,207 | 3/1981 | Nicolay et al. | 29/580 |
| 4,255,209 | 3/1981 | Morcom et al. | 148/175 |
| 4,260,436 | 4/1981 | Taylor | 29/580 |
| 4,269,636 | 5/1981 | Rivoli et al. | 148/175 |
| 4,286,374 | 9/1981 | Hantusch | 29/591 |
| 4,369,565 | 1/1983 | Muramatsu | 29/580 |
| 4,409,609 | 10/1983 | Fukuda | 357/55 |
| 4,420,874 | 12/1983 | Funatsu | 29/576 W |

OTHER PUBLICATIONS

Lillja et al., Process for Fabrication of Shallow and Deep Silicon Dioxide Filled Trenches: IBM Technical Disclosure Bulletin, vol. 22, No. 11, Apr. 1980.

"VIP for Bipolars: Dielectric Isolation," Electronics, vol. 45, Jul. 3, 11972, pp. 39 and 41.

R. C. Henderson et al., "Issues in Fabricating Electron Devices with Submicrometer Dimensions," J. Vac. Sci. Technol., vol. 16(2), Mar./Apr. 1979, pp. 260–268.

Primary Examiner—Upendra Roy
Attorney, Agent, or Firm—Finnegan, Henderson, Farabow, Garrett & Dunner

[57] ABSTRACT

A groove having a semiconductor layer buried therein is formed on one main surface of a semiconductor substrate, said groove providing a region for separating adjacent semiconductor elements. In the first step, a groove is formed on the substrate surface, followed by depositing a semiconductor layer thick enough to fill the groove. A substantial difference in impurity concentration is provided between the semiconductor layer within the groove and the other region of the semiconductor layer. The semiconductor layer is selectively allowed to remain within the groove by utilizing the difference in impurity concentration.

18 Claims, 41 Drawing Figures

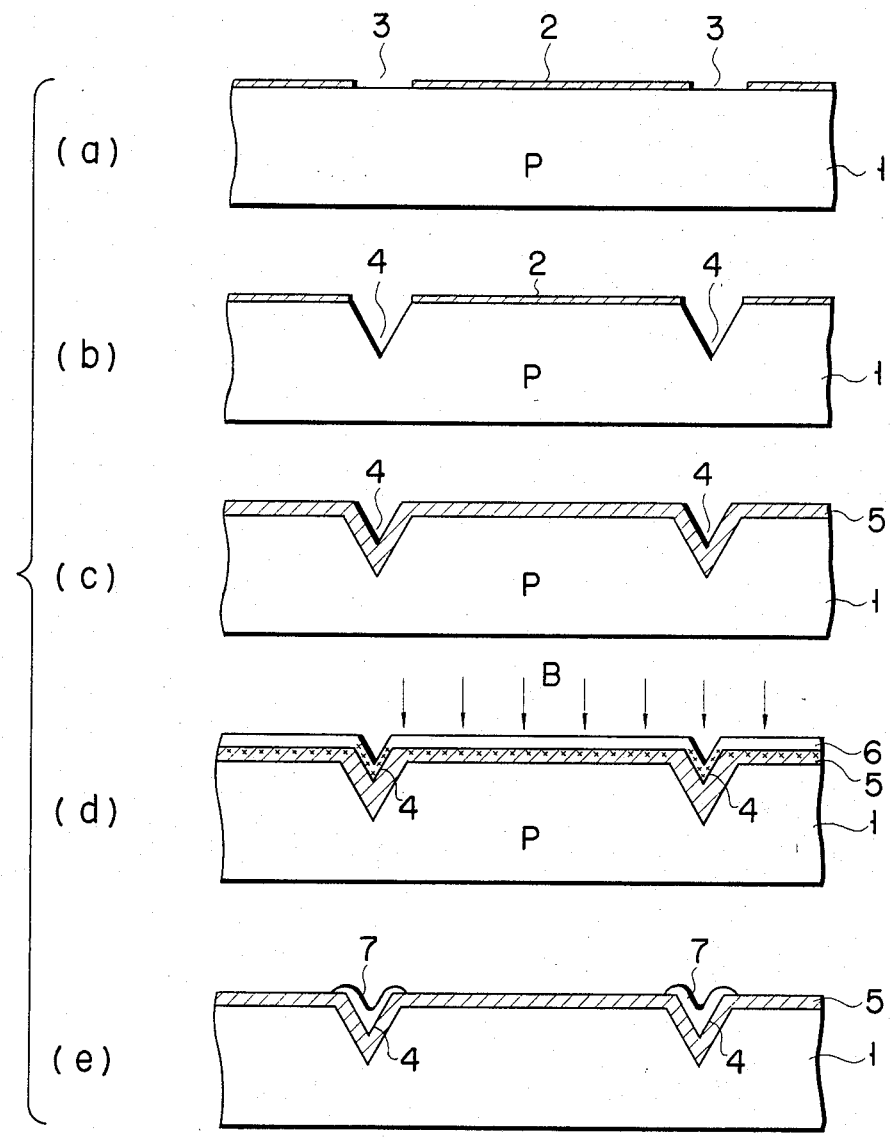
F I G. 1

F I G. 3
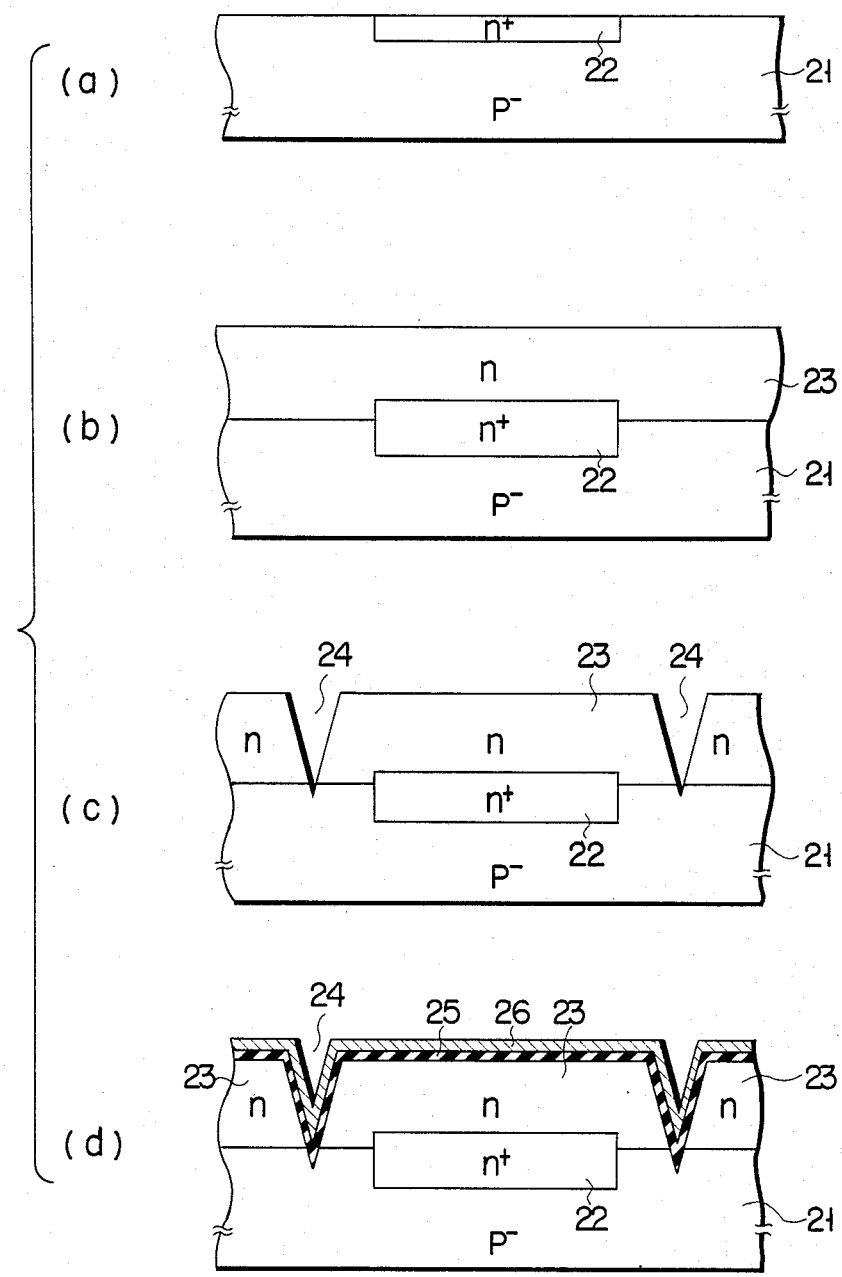

METHOD OF MAKING ISOLATION GROOVES BY OVER-FILLING WITH POLYCRYSTALLINE SILICON HAVING A DIFFERENCE IN IMPURITY CONCENTRATION INSIDE THE GROOVES FOLLOWED BY ETCHING OFF THE OVERFILL BASED UPON THIS DIFFERENCE

This is a continuation of application Ser. No. 285,507, filed July 21, 1981, abandoned.

BACKGROUND OF THE INVENTION

This invention relates to a method of producing a semiconductor integrated circuit, particularly, to an improved method of forming a separation region for semiconductor elements.

A semiconductor integrated circuit tends to be prominently enlarged in scale in accordance with increases in integration density and diversification of logic functions, with the result that the demand for high resolution of the semiconductor element reaches a sub-micron order. Naturally, it is a matter of serious concern in this field to develop an improved technique for separating the semiconductor elements for achieving the desired resolution mentioned above.

Various methods of separating semiconductor elements by using a dielectric material have hitherto been proposed for increasing the integration density, including the following:

(1) LOCOS (Local Oxidation of Silicon) method or Isoplanar method silicon substrate is selectively converted into a thick $SiO_2$ layer for providing a region for separating semiconductor elements.

(2) IPOS (Insulation by oxidized Porous Silicon) a silicon substrate is selectively made porous, whereafter the porous region is oxidized to provide a region for separating semiconductor elements.

(3) VIP (V-groove Isolation Polycrystal backfill) method: A substrate surface is selectively etched anisotropically so as to form a V-groove, followed by oxidizing the groove surface and, then, filling the groove with polycrystalline silicon. Finally, the surface of the polycrystalline silicon layer is mechanically polished and smoothed.

Prior art method (1) mentioned above is applied in general to MOS-LSI, bipolar LSI, etc. However, method (1) involves an oxidation treatment for a long period of time under high temperatures, with the result that, in the case of bipolar LSI, an outward diffusion occurs from the buried layer, leading to a lowered withstand voltage of the pn junction. It will also invite pattern deformation due to side oxidation, thereby in the case of, for example, MOS-LSI, altering the width of the channel region which influences the characteristics of the device, leading to varied characteristics of the device. Also, in the case of etching and, then, oxidizing a silicon substrate, so-called "bird's beak" and "bird's head" are brought about, leading in some cases to breakage of the Al wiring.

Prior art method (2) is also defective in that a change in volume is brought about in the step of oxidizing the porous region, leading to strained silicon substrate, breakage of the substrate, current leakage through the pn junction, etc. As a matter of fact, prior art method (2) has not yet been put to practical use. Further, prior art method (3) leaves room for further improvement in, particularly, the precision of the surface polishing technique. Naturally, prior art method (3) is low in yield, resulting in high costs. Also, negative influences are induced into the element characteristics by the mechanical polishing. Such being the situation, proir art method (3) has not yet been put to practical use except in special cases.

SUMMARY OF THE INVENTION

An object of this invention is to provide a method of manufacturing a semiconductor circuit which makes it possible to form a smooth and fine separation region of semiconductor elements by simple steps.

According to this invention, there is provided a method of producing a semiconductor integrated circuit, comprising the steps of:

forming a groove on one main surface of a semiconductor substrate, said groove defining an island region;

oxidizing at least the surface of the groove;

depositing a semiconductor layer on the entire region of said surface of the substrate in such a degree as to fill the groove completely;

making the semiconductor layer deposited within the groove substantially different in impurity concentration from the other region of the semiconductor layer; and selectively removing the semiconductor layer deposited outside the groove by utilizing the difference in impurity concentration so as to leave the semiconductor layer filled in the groove to provide a region for separating semiconductor elements.

DETAILED DESCRIPTION OF THE PREFERRED EMBODIMENTS

In this invention, a groove is formed first on one main surface of a semiconductor substrate, followed by depositing a semiconductor layer such as polycrystalline silicon (polysilicon) thick enough to fill the groove. Then, a marked difference in impurity concentration is provided between the semiconductor layer filling the groove and the other portion of the semiconductor layer, followed by selectively removing the semiconductor layer outside the groove by utilizing the difference in impurity concentration. As a result, the groove filled with the remaining semiconductor layer provides a region for separating semiconductor elements.

The difference in impurity concentration can be provided by selectively introducing an impurity into the semiconductor layer filling the groove (method A), or by selectively introducing an impurity into the semiconductor layer outside the groove (method B). Let us describe first method A mentioned above, with method B described later.

In method A, a V-shaped groove is selectively formed on the surface of a semiconductor substrate such that the groove defines an island region. Then, the entire region of the substrate surface is oxidized, followed by depositing on the oxide layer a first polysilicon layer which is not doped with an impurity and, subsequently, implanting a p-type impurity, e.g., boron ions. It should be noted that the polysilicon layer is thicker within the V-shaped groove than on the island region in the direction perpendicular to the substrate surface. Thus, the voltage for the ion implantation is controlled such that the ions pass through the polysilicon layer on the island region alone, with the ions remaining within the polysilicon layer within the groove. After the impurity implantation, the entire substrate is subjected to a first heat treatment so as to activate the boron ions, followed by selectively etching the polysilicon layer which does not contain boron ions. Then, a second polysilicon layer thick enough to fill the V-shaped groove is deposited, followed by applying a second heat treatment for diffusing the boron ions within the V-shaped groove. Further, the second polysilicon layer outside the groove, which does not contain boron, is selectively etched and the substrate surface is smoothened. Finally, a semiconductor element is formed within the island region defined by the V-shaped groove.

Figure 1:
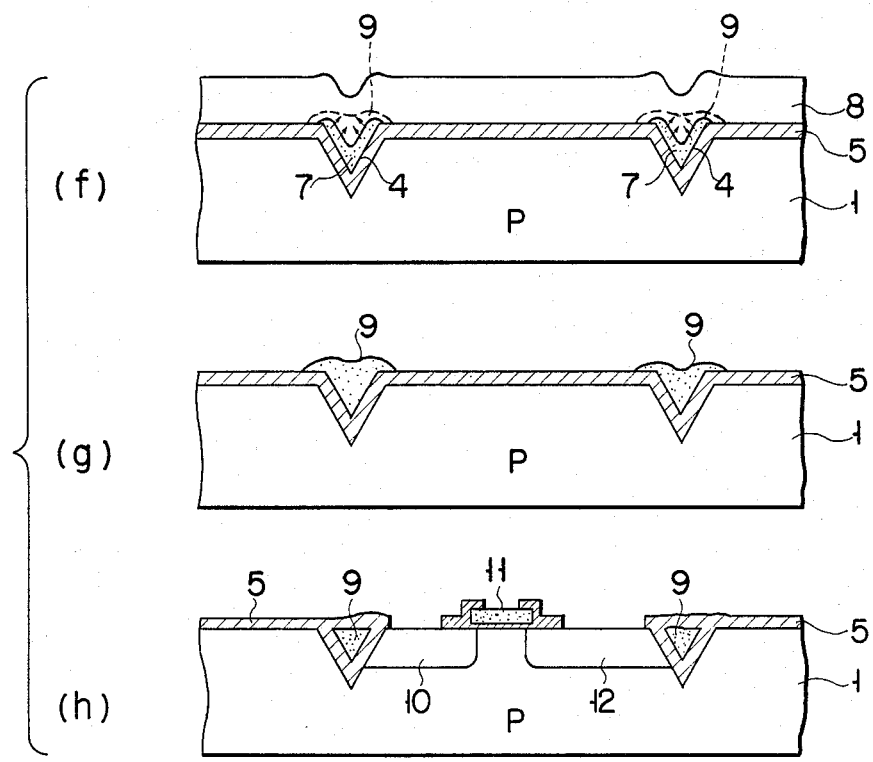
FIGS. 1(a) to 1(h) are cross sectional views sequentially showing a method according to one embodiment of this invention.

FIGS. 1(a) to 1(h) collectively show an example of producing a MOS integrated circuit by employing method A. As seen from FIG. 1(a), a thin oxide film 2, e.g., 500 Å thick, formed on the surface of a p-type silicon substrate 1 having, for example, a (100) plane is selectively removed so as to define an opening 3. Then, the substrate 1 is selectively etched with a KOH solution so as to form a V-shaped groove 4 (FIG. 1(b)). The groove 4 is, for example, 1 $\mu$m deep. Further, an oxide film 5 having a thickness of, for example, 3,000 to 4,000 Å is formed on the entire surface by an oxidation treatment at 1,000° C. under an oxidizing atmosphere as shown in FIG. 1(c). In the subsequent steps of a p-type impurity implantation and heat treatment, the oxide film 5 serves to prevent the p-type impurity from being diffused into the semiconductor substrate. Then, a first polysilicon layer 6, which is not doped with an impurity, is deposited in a thickness of, for example, 2,000 Å on the entire surface by means of, for example, LPCVD (Low Pressure Chemical Vapor Deposition). The polysilicon layer 6 is so satisfactory in step coverage as to be rendered substantially uniform in thickness through the groove region and island region. Then, a p-type impurity, e.g., boron ions, is implanted into the entire surface region.

Figure 2:
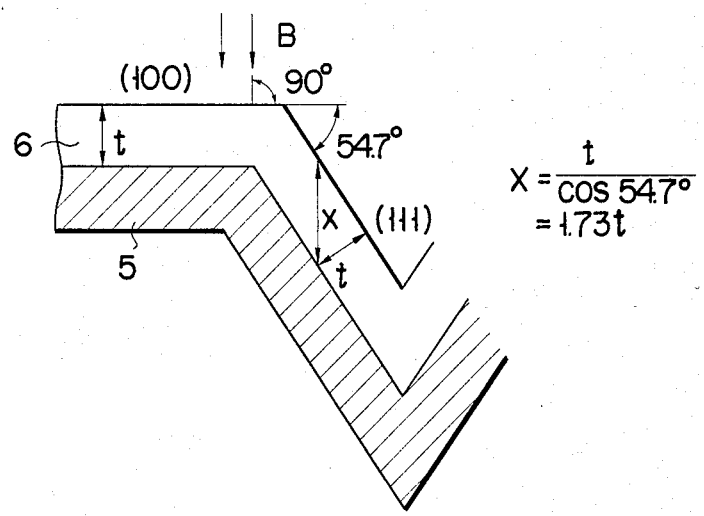
FIG. 2 is an enlarged cross sectional view showing a semiconductor substrate for explaining the method of this invention.
Figure 3:
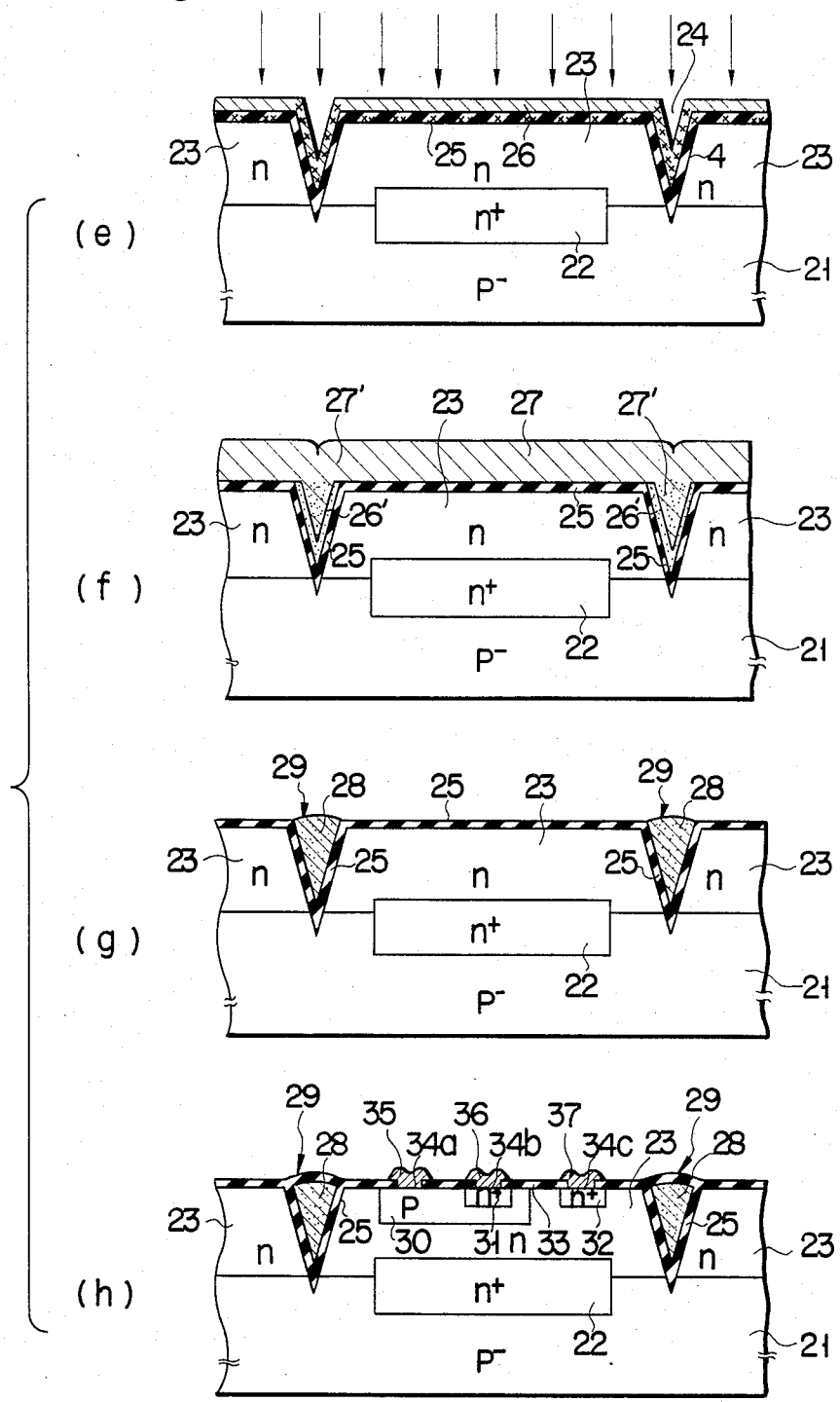
FIGS. 3(a) to 3(h) are cross sectional views sequentially showing a method according to another embodiment of this invention.

FIG. 2 shows how to determine the impurity injection energy. As mentioned above, the polysilicon layer 6 is substantially uniform in thickness "t" throughout the groove region and island region. It should be noted in this connection that the boron ions are incident to the polysilicon layer 6 in a direction perpendicular to the substrate surface. Thus, the effective thickness "x" of the layer 6 within the groove 4 in the ion incident direction is: $x = t/\cos 54.7° = 1.73t$, as seen from FIG. 2. If the actual thickness "t" of the layer 6 is 2,000 Å, the effective thickness "x" is 3,460 Å. In this invention, the projection range $R_p$ of boron ions is selected to meet the formula, $t + \sigma < R_p < x$, where "$\sigma$" represents the standard deviation of the ions. As a result, boron ions are implanted into the polysilicon layer 6 within the groove 4 and pass through the layer 6 in the island region as shown by the marks "x" in FIG. 1(d). If "t" is about 2,000 Å, boron ions are implanted at about 100 KeV for achieving the condition shown in FIG. 1(d). After the implantation, the polysilicon layer 6 is subjected to a first heat treatment for about 10 minutes at 1,000° C. under a non-oxidizing atmosphere so as to activate the boron contained in the layer 6 within the groove 4. As a result, the layer 6 within the groove 4 is enabled to exhibit a p-type conductivity. Then, the polysilicon layer 6 is etched with a KOH solution. As described in "J. Vac. Sci. Technol. 16(2) (March/April 1979, P. 260)", the etching permits selectively removing the polysilicon layer which does not contain boron, with the p-type polysilicon layer left substantially unremoved. It follows that a p-type polysilicon layer 7 alone remains within the groove 4 as shown in FIG. 1(e).

In the next step, a second polysilicon layer 8 thick enough to fill the groove 4 is formed on the entire surface as shown in FIG. 1(f). The layer 8, which does not contain an impurity, is, for example, 1.3 $\mu$m thick. Then, a second heat treatment, which is longer than the first heat treatment, is applied for diffusing the boron contained in the p-type polysilicon layer 7 into the second polysilicon layer 8 within the groove 4 as denoted by arrows so as to form a p-type polysilicon layer 9. Further, an etching with a KOH solution is applied again so as to remove selectively the polysilicon layer 8 which does not contain boron as shown in FIG. 1(g). Naturally, the p-type polysilicon layer 9 within the groove 4 is not removed in this etching step, with the result that the surface region is rendered substantially smooth as seen from the drawing. Finally, the surface of the polysilicon layer 9 is oxidized and, then, a semiconductor element, e.g., a source 10, a gate 11 and a drain 12, is formed in the island region as shown in FIG. 1(h) so as to produce a desired semiconductor integrated circuit.

Method A can also be employed for separation of semiconductor elements comprising an epitaxial layer, such as a bipolar IC, as in the embodiment shown in FIGS. 1(a) to 1(h) except that the V-shaped groove should be deep enough to extend through an epitaxial layer of a second conductivity type formed on the semiconductor substrate. Specifically, FIGS. 3(a) to 3(h) collectively show how to produce an npn bipolar IC by method A of this invention.

In the first step, an n+ buried layer 22 is selectively formed on the main surface of a p− silicon substrate 21 having a (100) plane as shown in FIG. 3(a), followed by growing an n-type silicon epitaxial layer 23 about 2 $\mu$m thick on the substrate surface (see FIG. 3(b)). Then, a V-shaped annular groove 24 having a depth of, for example, about 2.5 $\mu$m and a width of about 3 $\mu$m is formed in a manner to surround the n+ buried layer 22 by means of selective etching which uses a KOH type etchant as shown in FIG. 3(c). Naturally, the groove 24 extends through the silicon epitaxial layer 23 to reach the surface region of the substrate 21 and defines an island region. Further, an oxide film 25 about 1,500 Å thick is formed throughout the groove region and island region by means of thermal oxidation under an oxidizing atmosphere of 1,000° C., followed by depositing a first undoped polysilicon layer 26 about 2,000 Å thick by means of low pressure CVD or radio frequency CVD as shown in FIG. 3(d). Since polysilicon is quite satisfactory in step coverage, the polysilicon layer 26 is substantially uniform throughout the groove region and island region.

Then, a p-type impurity, e.g. boron, is implanted by means of ion implantation method. In this step, the projection range $R_p$ of boron ions is selected to meet the formula, $t + \sigma < R_p < t$, where "$\sigma$" represents the standard deviation of the ions and "t" denotes the thickness of the layer 26, as described previously in conjunction with FIG. 2. As a result, boron ions are implanted into the polysilicon layer 26 within the V-shaped groove 24, but pass through the layer 26 in the island region as shown in FIG. 3(e). Specifically, where the polysilicon layer 26 is 2,000 Å thick, the boron ions are implanted at an acceleration energy of 100 KeV for achieving the condition shown in FIG. 3(e). Then, the polysilicon layer 26 is subjected to a first heat treatment so as to activate the boron contained in the layer 26 within the groove 24 and, thus, to enable said layer 26 to exhibit a p-type conductivity. Further, the polysilicon layer 26 is etched with an etchant of a KOH solution. As a result, the undoped region alone of the polysilicon layer 26 is selctively removed, with the p-type polysilicon layer within the groove left substantially unremoved as described previously. In other words, a p-type polysilicon layer 26' alone remains within the groove 24. Further, a second undoped polysilicon layer 27 thick enough to fill the groove 24, e.g., about 3 $\mu$m thick, is deposited, followed by applying a second heat treatment to the polysilicon layer 27. The heat treatment permits the boron contained in the p-type polysilicon layer 26' to be diffused into the second polysilicon layer 27 so as to form a p-type polysilicon layer 27' as shown in FIG. 3(f).

After the second heat treatment, an etching with a KOH etchant is applied again, with the result that the undoped second polysilicon layer 27 is selectively removed, with the p-type polysilicon layer 27' within the groove 24 left substantially unremoved. In other words, the groove 24 is filled with a p-type polysilicon layer 25 and provides a region 29 for separating semiconductor elements. In addition, the surface of the polysilicon layer 28 is substantially flush with the surface of the oxide film 25 in the island region as seen from FIG. 3(g). Then, a p-type base region 30, an n+-type emitter region 31, and an n+-type collector electrode region 32 are formed by an ordinary method within the silicon epitaxial layer 23 defined by the separation region 29. Further, an oxide film 33 is formed on the entire surface by means of thermal oxidation, followed by making contact holes 34a to 34c in the oxide film 33. Finally, an aluminum film is formed on the entire surface by means of vacuum vapor deposition, followed by selectively removing the Al film so as to form a base electrode 35, an emitter electrode 36 and a collector electrode 37, thereby producing an npn bipolar integrated circuit as shown in FIG. 3(h).

Figure 4:
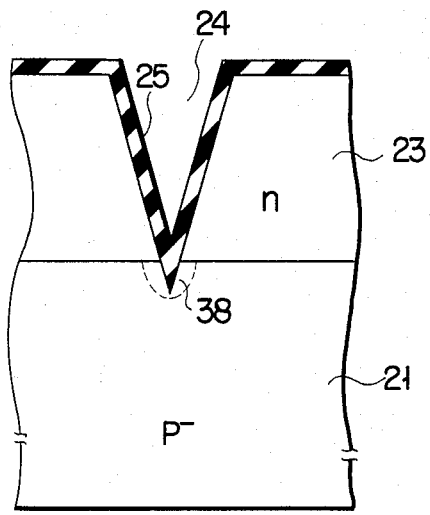
FIG. 4 is an enlarged cross sectional view showing the semiconductor substrate for explaining the method of this invention.

As described previously, the V-shaped groove 24 is formed to reach the p− silicon substrate 21. Thus, an n-type inversion region 38, i.e., region very low in impurity concentration, is formed in the first oxidation step at the boundary between the p− silicon substrate 21 and the oxide film 25 as shown in FIG. 4. What should be noted is that the inversion region 38 leads to reduction of withstand voltage between two adjacent n-type island regions (i.e., silicon epitaxial layer 23). As known to the art, metal ions such as Na+ and K+ are unavoidably contained in the oxide film 25, with the result that electrons are induced on the surface region of the oxide film 25 so as to form the inversion region 38. Also, boron atoms contained in the p− silicon substrate 21 are absorbed in the step of forming the oxide film 25. Naturally, the impurity concentration is lowered in the boundary region between the oxide film 25 and the substrate 21, leading to the formation of the inversion region 38. In order to prevent the formation of the inversion region, it is desirable to form a p+ region in the p− substrate such that the V-shaped groove extends to reach the p+ region. FIGS. 5(a) to 5(g) collectively show how to produce an integrated circuit of this type.

Figure 5:
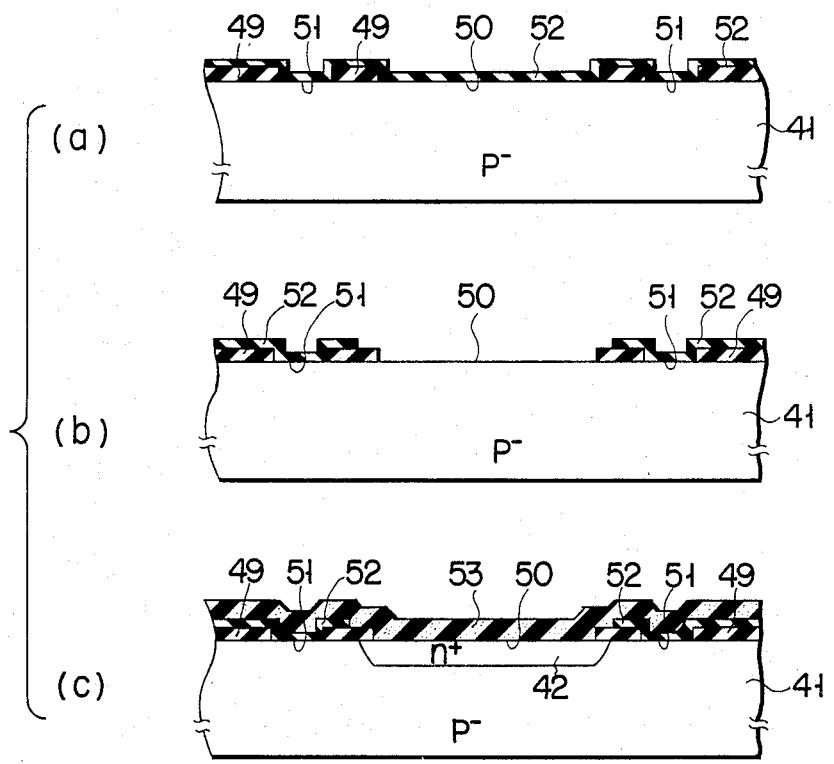
FIGS. 5(a) to 5(g) are cross sectional views showing a method according to another embodiment of this invention.
Figure 5:
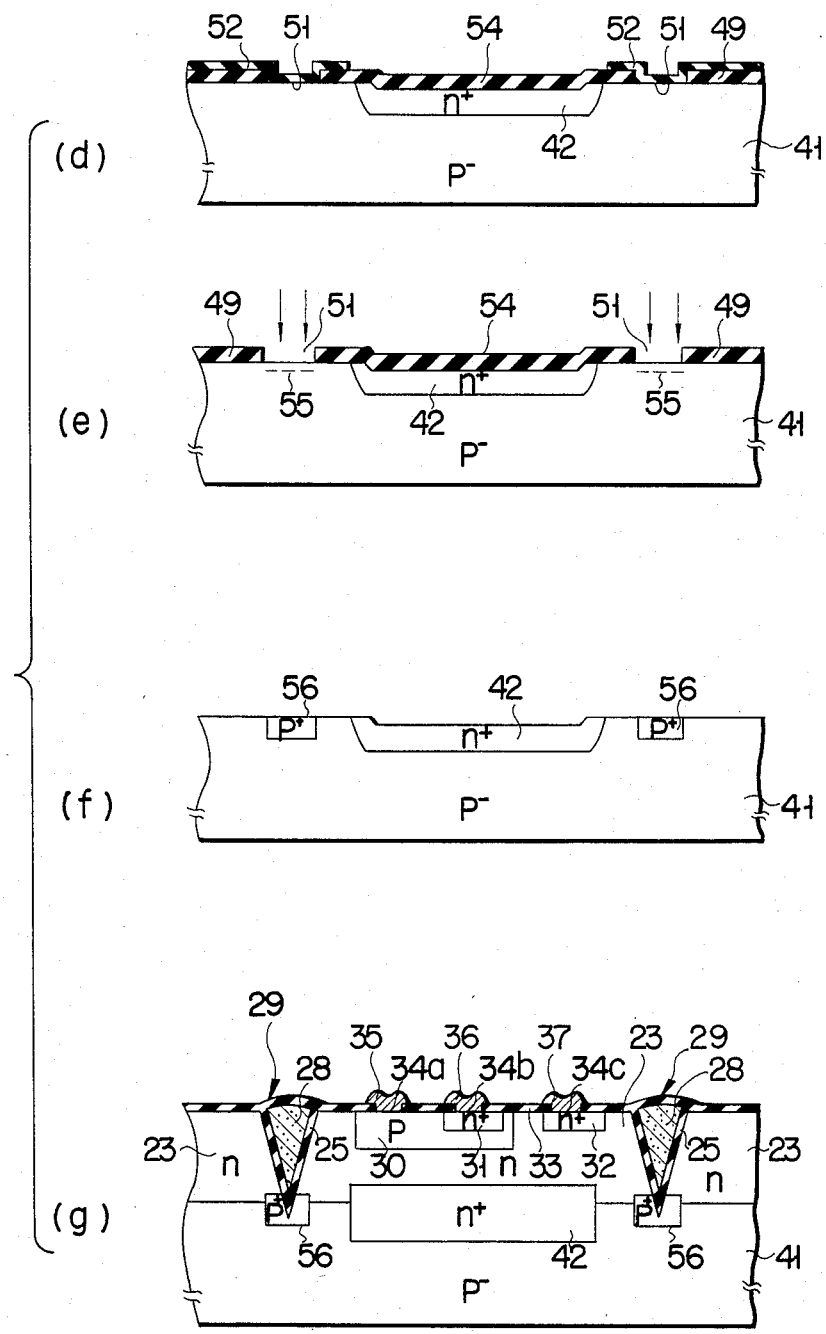

In the first step, a thermal oxide film 49 is formed on the surface of a p− silicon substrate 41, followed by selectively removing the oxide film 49 by photoetching method so as to provide openings 50 and 51 and subsequently forming a silicon nitride film 52 on the entire surface as shown in FIG. 5(a). Then, the silicon nitride film 52 within the opening 50 is removed as shown in FIG. 5(b), followed by forming an As-containing glass film (or AsSG film) 53 on the entire surface. Further, the AsSG film 53 is heated so as to diffuse the As contained in the film 53 into the substrate 41 through the opening 50 so as to form an n+ buried layer 42 as shown in FIG. 5(c). After the heat treatment, the AsSG film 53 is removed and, then, a thermal oxide film 54 is formed on the exposed surface of the substrate 41 under an oxidizing atmosphere, with the remaining silicon nitride film 52 used as an oxidation resistant mask as shown in FIG. 5(d). In this step, the n+ buried layer 42 is enlarged. Further, the remaining silicon nitride film 52 is removed so as to expose the substrate surface through the opening 51. Then, boron is injected into the substrate 41 through the opening 51 by means of ion implantation method so as to form an annular boron injected layer 55 as shown in FIG. 5(e). When subjected to a heat treatment, the boron within the layer 55 is diffused within the substrate 41 so as to form a p+ region 56 and, then, the oxide films 49 and 54 are etched away as shown in FIG. 5(f). Under this condition, the steps shown in FIGS. 3(b) to 3(h) are applied to the substrate 41 having the p+ region 56 formed therein so as to produce an npn bipolar integrated circuit as shown in FIG. 5(g). To be brief, the embodiment of FIG. 5 is equal to the embodiment of FIG. 3 except that the substrate 41 shown in FIG. 5(f) is substituted for the substrate 21 in the embodiment of FIG. 3.

In the embodiment of FIG. 5, the lower end of the V-shaped groove 24 is positioned within the p+ region 56, rendering it possible to prevent an inversion region from being formed around the lower end of the groove 24. In addition, the n+ buried layer 42 and the p+ region 56 are self-aligned, rendering it possible to shorten the distance between the n+ buried layer 42 and the p+ region 56. In other words, the integration density can be increased.

In method B of this invention, an impurity is selectively introduced into a semiconductor layer within an island region so as to provide a difference in impurity concentration of the semiconductor layer between the island region and a groove region as described previously. In this case, a plurality of deposition layers differing from each other in properties are formed on a semiconductor substrate. The uppermost deposition layer is doped with the highest concentration of impurity.

Then, the deposition layers are selectively removed and an annular groove is formed in the substrate with the remaining deposition layers used as a mask, said groove defining an island region. Further, the exposed surface of the substrate within the groove is oxidized, followed by depositing on the entire surface a semiconductor layer such as an undoped polysilicon layer thick enough to fill completely the groove. An impurity equal in conductivity type to that contained in the uppermost deposition layer is diffused from above the semiconductor layer. At the same time, the impurity contained in the uppermost deposition layer is upwardly diffused into the semiconductor layer. The impurity diffusion is continued until overlapping occurs between the upwardly and downwardly diffused regions. As a result, the semiconductor layer is doped with a high concentration of impurity except in the groove region. Finally, the doped semiconductor layer is removed by etching, with the result that the undoped semiconductor layer alone remains within the groove so as to provide a region for separating two adjacent island regions.

FIGS. 6(a) to 6(g) collectively show how to produce an integrated circuit by employing method B of this invention. In the first step, an $SiO_2$ film 62 about 500 Å thick, an $Si_3N_4$ film 63 about 3,000 Å thick, and a PSG film 64 about 3,000 Å thick are successively formed on one main surface of a silicon substrate 61 having, for example, a (100) plane as shown in FIG. 6(a). The $SiO_2$ film 62 is formed by thermal oxidation under an oxidizing atmosphere. The $Si_3N_4$ film 63 is formed by CVD and, then, sintered at 1,000° C. under $N_2$ atmosphere. Further, the PSG film 64, which contains a high concentration of phosphorus (P) acting as an n-type impurity, is formed by CVD. Then, these films 64, 63 and 62 are selectively removed in succession by photoetching method so as to selectively expose the substrate surface, followed by subjecting the exposed substrate to an anisotropic etching by using a KOH type etchant so as to form grooves 65a and 65b having a depth of, for example, 1 μm as shown in FIG. 6(b). Naturally, an island region 65c is defined by these grooves 65a and 65b. Further, an $SiO_2$ film 66 about 2,000 Å thick is formed in each of the grooves 65a and 65b at, for example, 900° C. and under a pressurized oxygen atmosphere, e.g., 9 atms.

In the next step, a polysilicon film 67 thick enough to fill completely the grooves 65a and 65b, e.g., 1.7 μm thick, is formed on the entire surface by CVD as shown in FIG. 6(c). Then, phosphorus is diffused from above into the polysilicon film 67 at 1,000° C. under an atmosphere of $POCl_3$ as shown in FIG. 6(d) so as to form an n+ layer 68. In this step, the phosphorus contained in the PSG film 64 is also diffused upward into the polysilicon film 67 so as to form an n+ layer 69. The diffusion treatment is continued until overlapping occurs between the n+ layers 68 and 69. For example, the heat treatment is performed at 900° C. for 30 minutes under an atmosphere of $POCl_3$. After the heat treatment, phosphorus is diffused into the entire polysilicon film except the regions within the grooves 65a and 65b as seen from the drawing.

Then, the n+ polysilicon layers 68 and 69 are selectively removed by etching with a suitable etchant, e.g., a mixture of $I_2$, HF and $CH_3COOH$, so as to allow undoped polysilicon layers 67a and 67b alone within the grooves 65a and 65b as shown in FIG. 6(e). A plasma etching, a reactive ion etching, etc. can also be employed for selective removal of the n+ polysilicon layers 68, 69. Further, the PSG film 64 is removed by etching, followed by forming an $SiO_2$ film 71 about 4,000 Å thick on the surface of each of the polysilicon layers 67a, 67b within the grooves 65a, 65b by means of selective oxidation under oxygen atmosphere at 1,000° C. as shown in FIG. 6(f). Naturally, the $Si_3N_4$ film 63 acts as a mask in this selective oxidation step. Finally, the $Si_3N_4$ film 63 and the $SiO_2$ film 62 are removed and a desired semiconductor element is formed within the island region 65c. In the embodiment of FIG. 6(g), a MOS transistor is formed within the island region 65c by the ordinary method. It is seen that the device of FIG. 6(g) comprises an oxide insulation film 72, a source region 73, a drain region 74, a gate oxide film 75, a polysilicon gate electrode 76, a source electrode 77, and a drain electrode 78. It is important to note that the pn junctions formed within the island region extend to reach the grooves for separating adjacent island regions in the embodiment of FIG. 6(g), rendering it possible to increase the integration density of the device.

Method B can also be employed for separation of semiconductor elements comprising an epitaxial layer like a bipolar IC as in the embodiment shown in FIGS. 6(a) to 6(g) except that the groove should be deep enough to extend through an epitaxial layer of a second conductivity type formed on the semiconductor substrate. Specifically, FIGS. 7(a) to 7(h) collectively show how to produce an npn bipolar IC by method B of this invention.

In the first step, an n-type buried layer 82 is formed on one main surface of a p-type silicon substrate 81 having, for example, a (911) plane, followed by forming an n-type epitaxial layer 83 by the ordinary method on the substrate 81 as shown in FIG. 7(a). Then, an $SiO_2$ film 84 about 500 Å thick, an $Si_3N_4$ film 85 about 3,000 Å thick, and a PSG film 86 about 3,000 Å thick are successively formed on the surface of the epitaxial layer 83 as shown in FIG. 7(b). The $SiO_2$ film 84 is formed by thermal oxidation under an oxygen atmosphere. The $Si_3N_4$ film 85 is formed by CVD and, then, sintered at 1,000° C. under nitrogen atmosphere. Further, the PSG film 86, which contains phosphorus, is formed by CVD. These films 84, 85, 86 are selectively removed by photoetching so as to selectively expose the surface of the epitaxial layer 83, followed by anisotropically etching the epitaxial layer 83 with a KOH type etchant so as to form V-shaped grooves 87a and 87b as shown in FIG. 7(c). It should be noted that the grooves 87a, 87b extent through the epitaxial layer 83 and an island region 87c is defined by these grooves.

In the next step, an $SiO_2$ film 88 about 2,000 Å thick is formed in each of the grooves 87a and 87b at 900° C. and under a pressurized oxygen atmosphere, e.g., 9 atms., followed by forming a polysilicon film 89 on the entire surface by CVD as shown in FIG. 7(d). The polysilicon film 89 should be thick enough to fill completely the grooves 87a, 87b. Phosphorus is diffused from above into the polysilicon film 89 at 900° C. under an atmosphere of $POCl_3$ so as to form an n+ region 90. In this step, the phosphorus contained in the PSG film 86 is also diffused upward into the polysilicon film 89 so as to form another n+ region 91. The heat treatment is continued until overlapping occurs between the n+ regions 90 and 91, e.g., performed at 900° C. for 30 minutes under an atmosphere of $POCl_3$. After the heat treatment, phosphorus is diffused into the entire polysilicon film except the regions within the grooves 87a, 87b as seen from FIG. 7(d). Then, the n+ regions 90 and 91 are selectively removed by etching with a suitable etchant, e.g., a mixture of $I_2$, HF and $CH_3COOH$, so as to allow undoped polysilicon regions 89a, 89b alone to remain within the grooves 87a, 87b as shown in FIG. 7(e). A plasma etching, a reactive ion etching, etc. can also be employed for removing the n+ regions 90, 91. Further, the PSG film 86 is removed by etching, followed by forming an $SiO_2$ film 92 about 4,000 Å thick on the surface of each of the undoped polysilicon regions 89a, 89b by means of selective oxidation at 1,100° C. under an oxygen atmosphere as shown in FIG. 7(f). Naturally, the $Si_3N_4$ film 85 acts as a mask in this selective oxidation step. Then, the $Si_3N_4$ film 85 and the $SiO_2$ film 92 are removed, followed by forming an oxide film 93 on the entire surface as shown in FIG. 7(g). Finally, a desired semiconductor element is formed in the island region 87c as shown in FIG. 7(h). It is seen that the device of FIG. 7(h) comprises an emitter region 94, a collector contact 95 and a base region 96.

In the embodiment of FIGS. 7(a)–7(h), an n-type inversion layer may be formed at the boundary between the oxide film 88 and the p-type silicon substrate 81 as in FIG. 4, leading to reduction in the withstand voltage between two adjacent island regions. The difficulty can be overcome by forming a p+ region in a manner to surround the bottom region of the V-shaped groove as in the embodiment of FIGS. 5(a)–5(h).

Figure 6:
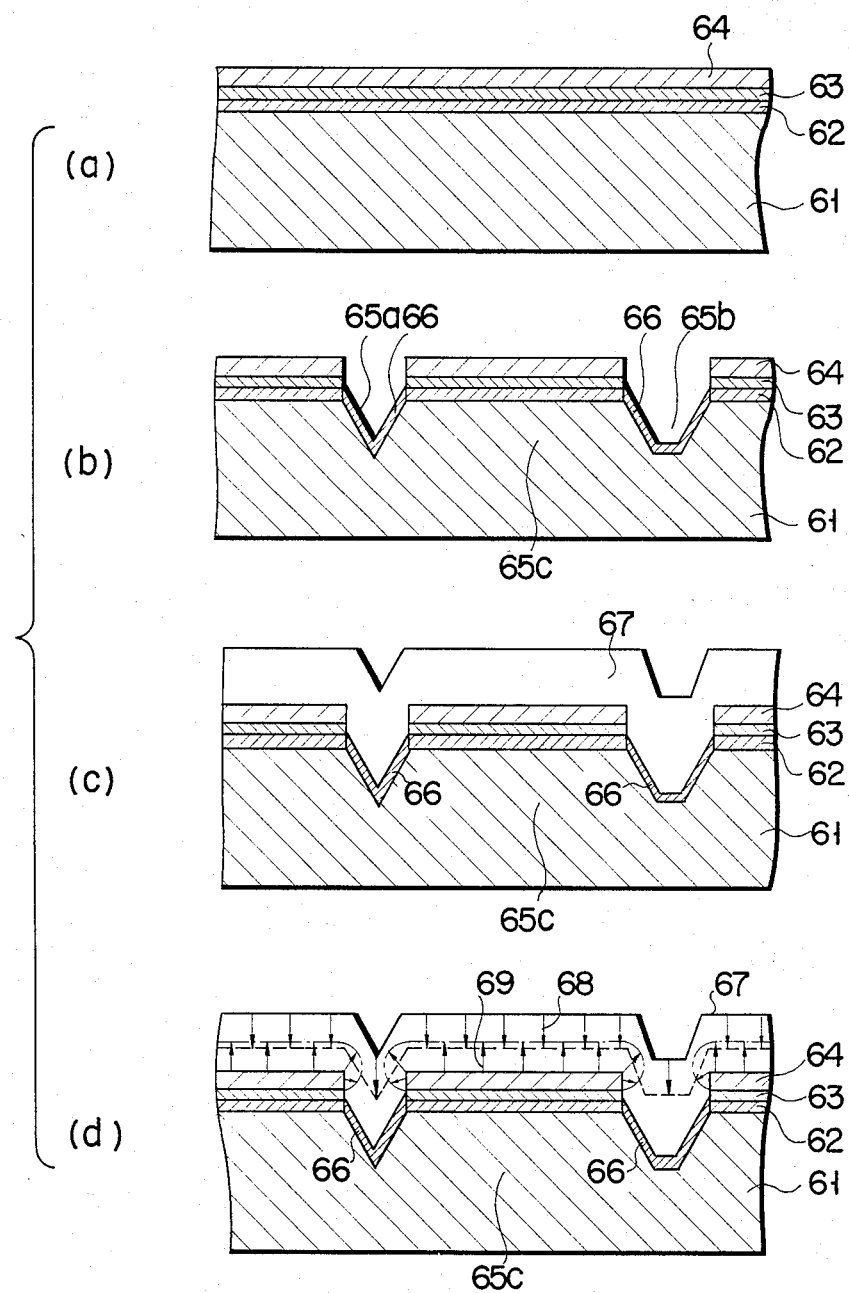
FIGS. 6(a) to 6(g) are cross sectional views showing a method according to another embodiment of this invention.
Figure 6:
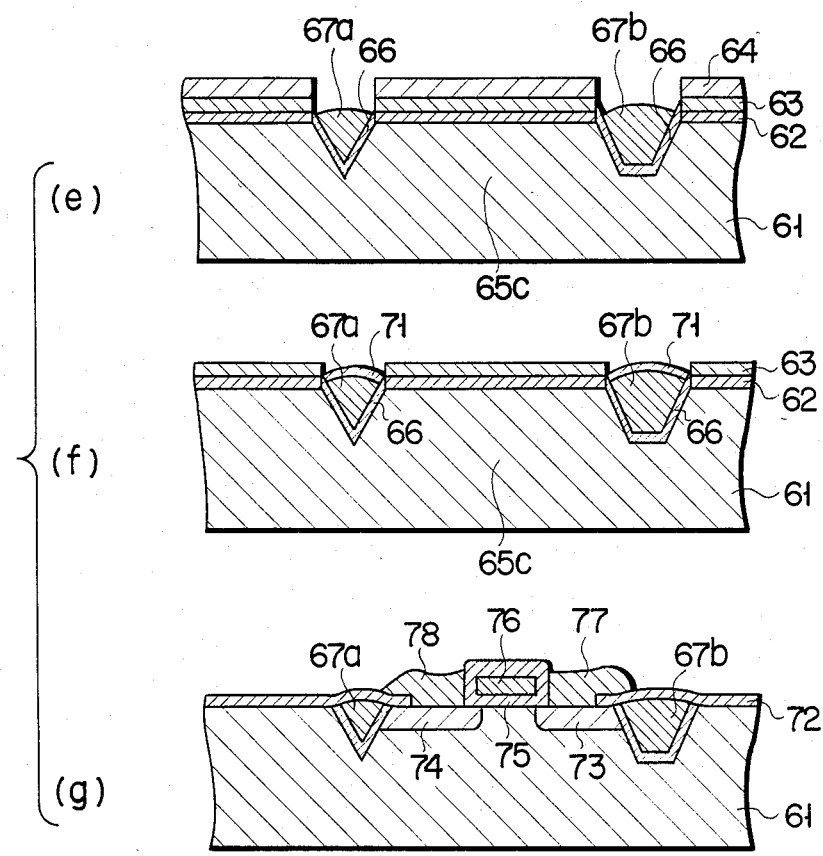
Figure 8:
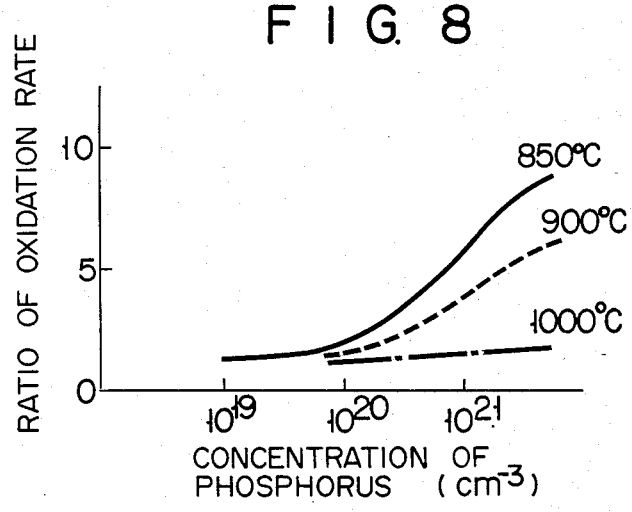
FIG. 8 is a graph for explaining the method of this invention.
Figure 7:
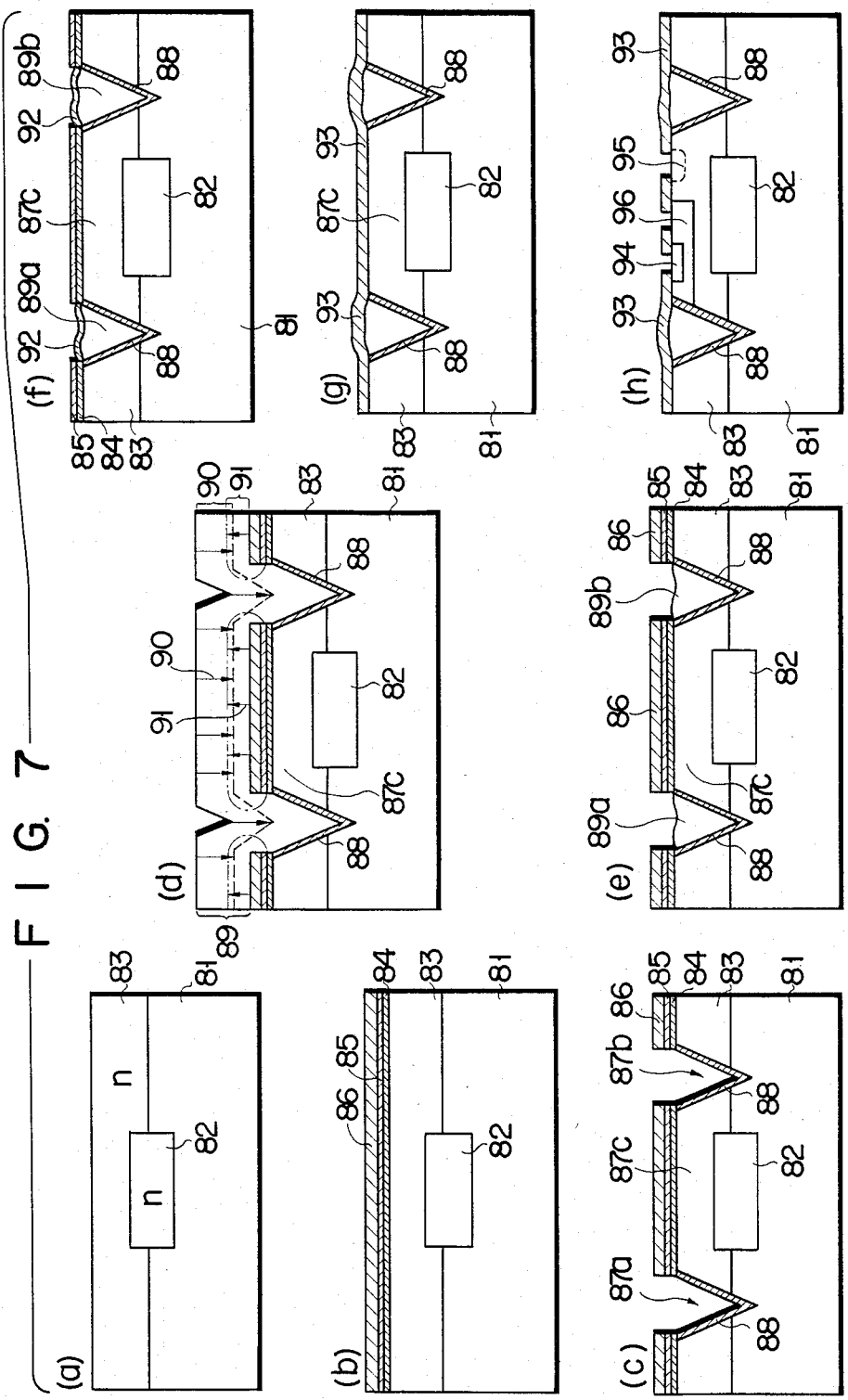
FIGS. 7(a) to 7(h) are cross sectional views showing a method according to still another embodiment of this invention.

In each of the embodiments of FIGS. 6 and 7, a PSG film is used for upwardly diffusing an n-type impurity, i.e., phosphorus, into a polysilicon film. However, the PSG film may be replaced by a polysilicon film or amorphous silicon film doped with a high concentration of phosphorus and arsenic, or arsenic alone. Also, the n+ polysilicon layer can be selectively removed by means of oxidation under a low temperature and high pressure in place of etching employed in the embodiments of FIGS. 6 and 7. To be more specific, the oxidation speed of an n+ polysilicon film is markedly higher than that of an undoped polysilicon film as seen from FIG. 8 showing the oxidation speed of polysilicon at 850° C., 900° C. and 1,000° C. relative to the phosphorus concentration of the polysilicon. The "oxidation speed ratio" mentioned in FIG. 8 represents the oxidation speed ratio of a phosphorus doped polysilicon to an undoped polysilicon. As apparent from FIG. 8, a polysilicon film doped with, for example, $10^{21}$ atoms $cm^{-3}$ of phosphorus is oxidized about 6 times faster than an undoped polysilicon film at 850° C., rendering it possible to remove selectively the doped polysilicon film by means of oxidation.

As described above in detail, methods A and B can be employed in this invention for forming a separation region of semiconductor elements. Method A can be summarized as follows:

(1) A polysilicon film is thicker within a V-shaped groove made in a semiconductor substrate or silicon epitaxial layer than on an island region with respect to the implanting direction of an impurity like boron, rendering it possible to implant the impurity selectively into the polysilicon film within the groove.

(2) The etching rate of a polysilicon film doped with a p-type impurity like boron is markedly lower than that of an undoped polysilicon film with respect to a special etchant, rendering it possible to remove selectively the undoped polysilicon film, with the doped polysilicon film alone left unremoved within the groove.

(3) An undoped polysilicon film thick enough to fill the groove completely is formed on the entire surface, followed by applying heat treatment so as to diffuse the impurity contained in the doped polysilicon film within the groove into the undoped polysilicon film such that the doped region completely fills the groove. Then, the undoped polysilicon on the island region is selectively removed by etching with a special etchant.

As a result, the V-shaped groove is completely filled with p-type polysilicon so as to provide a satisfactory separation region. It should also be noted that the surface of the p-type polysilicon is substantially flush with the surface of the island region.

On the other hand, method B can be summarized as follows:

(1) A plurality of deposition layers having the uppermost layer doped with a high concentration of an n-type impurity like phosphorus are formed on a semiconductor substrate or silicon epitaxial layer, followed by forming a groove of optional shape, said groove defining an island region, in the substrate or epitaxial layer through the deposition layers. Then, an undoped polysilicon layer thick enough to fill completely the groove is formed on the entire surface, followed by heat treatment in the presence of an n-type impurity equal to that contained in the uppermost deposition layer. As a result, the impurity is diffused both downwardly and upwardly into the undoped polysilicon layer except the region within the groove.

(2) A polysilicon layer doped with a high concentration of an n-type impurity is markedly higher in etching rate with respect to a special etchant or in oxidation rate than an undoped polysilicon layer, rendering it possible to remove selectively the doped polysilicon layer, with the undoped polysilicon left unremoved within the groove.

Method B also permits forming a satisfactory separation region consisting of a groove filled with undoped polysilicon. Naturally, the surface of the undoped polysilicon is substantially flush with the surface of the island region.

As apparent from the foregoing descriptions, this invention produces various effects including the following:

(a) The VIP method described previously as prior art method (3) necessitates mechanically polishing the surface of the polysilicon layer filling a V-shaped groove. But, the polysilicon layer surface can be smoothened by a simple chemical etching in this invention, resulting in high yield and low manufacturing cost of the semiconductor device. In addition, bad influences are scarcely given to the characteristics of the produced device.

(b) The method of this invention does not necessitate a long heat treatment under high temperatures as in the LOCOS method described previously as prior art (1). Thus, re-distribution of the diffusion layers can be prevented in this invention, leading to improved characteristics of the semiconductor element.

(c) It is unnecessary in this invention to form a thick oxide film selectively, with the result that the pattern is not deformed and the wiring layer is not broken on the region for separating the adjacent semiconductor elements. In addition, anisotropic etching is employed in this invention, rendering it possible to define the island region substantially in conformity with the mask dimension. Thus, the characteristics of the semiconductor elements can be made uniform and the semiconductor device can be designed easily.

(d) This invention also permits achieving features of the prior art such as reduction of junction capacitance, improvement of integration density and reduction of floating capacitance of the wiring.

In the embodiments described above, the method of this invention is applied to the production of MOS integrated circuits and bipolar integrated circuits. But, it is to be understood that this invention can also be employed for the production of I²L (Integrated Injection Logic), ECL (Emitter Coupled Logic), and other semiconductor devices.

What is claimed is:

1. A method of manufacturing a semiconductor circuit comprising the steps in the order mentioned below of:
   (a) forming a groove on one main surface of a semiconductor substrate such that an island region is defined by said groove;
   (b) oxidizing said main surface of said substrate including at least the surface of said groove to form an oxide film;
   (c) depositing a first semiconductor layer on said oxide film formed in step (b);
   (d) implanting an impurity by ion implantation such that said first semiconductor layer within said groove alone is doped with said impurity, thereby creating a difference between the impurity concentration of said first semiconductor layer within said groove and the impurity concentration of said first semiconductor layer above and adjacent said groove, said implanting being accomplished by use of an ion implantation voltage such that said impurity remains in said first semiconductor layer within said groove alone and passes through said first semiconductor layer above and adjacent said groove;
   (e) heating said first semiconductor layer;
   (f) selectively removing the first semiconductor layer above and adjacent said groove by utilizing said difference in impurity concentration;
   (g) depositing a second semiconductor layer over said first semiconductor layer in said groove and on the substrate surface adjacent said groove, said second semiconductor layer being deposited to a depth greater than the depth of said groove so that at the location of said groove said second semiconductor layer fills said groove and extends above the main surface of said substrate;
   (h) introducing said impurity from said first semiconductor layer into said second semiconductor layer whereby the impurity concentration of said second semiconductor layer within the groove is substantially different from the impurity concentration of said second semiconductor layer above and adjacent said groove; and
   (i) selectively removing said second semiconductor layer above and adjacent said groove by utilizing the difference in impurity concentration so as to allow the second semiconductor layer to remain only within the groove and, thus, to provide a region for separating two adjacent island regions.

2. A method of manufacturing a semiconductor circuit comprising the steps in the order mentioned below of:
   (a) forming a plurality of deposition layers on the surface of a semiconductor substrate with said deposition layers including an uppermost layer doped with a high concentration of an impurity;
   (b) forming a groove on one main surface of said semiconductor substrate such that an island region is defined by said groove and such that said deposition layers are removed in the area of said groove;
   (c) oxidizing the surface of said groove to form an oxide film in said groove;
   (d) depositing a semiconductor layer over said oxide film in said groove and over said deposition layers on the substrate surface adjacent said groove, said semiconductor layer being deposited to a depth greater than the depth of said groove so that at the location of said groove said semiconductor layer fills said groove above the main surface of said substrate;
   (e) introducing said impurity from said uppermost layer into said semiconductor layer whereby the impurity concentration of said semiconductor layer within said groove is substantially different from the impurity concentration of said semiconductor layer above and adjacent said groove; and
   (f) selectively removing the semiconductor layer above and adjacent said groove by utilizing the difference in impurity concentration so as to allow the semiconductor layer to remain only within said groove and, thus, to provide a region for separating two adjacent island regions.

3. The method according to claim 1 or 2 wherein said groove is of a V-shape in cross-section.

4. The method according to claim 3 wherein an epitaxial layer is formed on said semiconductor substrate before step (a) and said V-shaped groove extends through said epitaxial layer to reach said substrate.

5. The method according to claim 1 wherein said impurity is P-type.

6. The method according to claim 1 wherein said impurity is boron.

7. The method according to claim 2 wherein said uppermost layer is doped with a high concentration of N-type impurity.

8. The method according to claim 2 wherein said step of introducing said impurity includes the additional step of diffusing an N-type impurity from above said semiconductor layer into said semiconductor layer.

9. The method according to claim 4 wherein an region equal in conductivity type to and high in impurity concentration than said semiconductor substrate is formed in said substrate and the bottom region of said V-shaped groove extends through said epitaxial layer and is positioned in said high impurity region area.

10. The method according to claim 9 wherein said impurity is boron.

11. The method according to claim 8 wherein an epitaxial layer is formed on said semiconductor substrate before said step of forming the deposition layers and said groove is formed in step (a) to extend through said epitaxial layer.

12. The method according to claim 11 wherein a region equal in conductivity type to and higher in impurity concentration than said semiconductor substrate is formed in said substrate and the bottom region of said groove extends through said epitaxial layer and is positioned in said high impurity region.

13. The method according to claim 1, 2, 7, 11 or 12 wherein at least one PN junction is formed in said island region defined by said groove.

14. The method according to claim 13 wherein at least one end of said PN junction is in direct contact with said groove.

15. The method according to claim 2, 7 or 8 wherein said uppermost deposition layer is selected from the group consisting of a silicon dioxide film, a polysilicon film, and an amophorous silicon film each containing phosphorus or arsenic.

16. The method according to claim 8 wherein said impurity diffused from above said semiconductor layer is selected from the group consisting of phosphorus and arsenic.

17. The method according to claim 8 wherein said step surface of said semiconductor substrate and depositing a silicon dioxide film doped with a high concentration of phosphorus or arsenic on said silicon nitride film; step (b) includes selectively removing the silicon dioxide film, the silicon nitride film, and the upper surface region of said substrate so as to form said groove; said semiconductor layer deposited in step (d) to fill said groove comprises polysilicon; said N-type impurity diffused from above said semiconductor layer is phosphorus; and step (f) includes removing the remaining silicon dioxide film, oxidizing the surface region of said semiconductor layer within said groove, and removing the remaining silicon nitride film.

18. The method according to claim 11 wherein said semiconductor substrate is a P-type silicon substrate; said epitaxial layer formed on said substrate is of N-type conductivity; said semiconductor layer filling said groove comprises polysilicon; said impurity diffused from above said semiconductor layer is phosphorus; and the surface region of said semiconductor layer filling said groove is oxidized.

* * * * *